(12) United States Patent
Hao et al.

(10) Patent No.: US 6,410,393 B1
(45) Date of Patent: Jun. 25, 2002

(54) SEMICONDUCTOR DEVICE WITH ASYMMETRIC CHANNEL DOPANT PROFILE

(75) Inventors: Ming-Yin Hao; Emi Ishida, both of Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/639,797

(22) Filed: Aug. 17, 2000

Related U.S. Application Data

(60) Provisional application No. 60/149,422, filed on Aug. 18, 1999.

(51) Int. Cl.$^7$ ............................................. H01L 21/336
(52) U.S. Cl. ........................ 438/286; 438/291; 438/525; 438/528
(58) Field of Search ................................. 438/286, 289, 438/291, 302, 407, 525, 528, 530, 545, 546

(56) References Cited

U.S. PATENT DOCUMENTS

| | | | |
|---|---|---|---|
| 5,223,445 A | * | 6/1993 | Fuse ........................... 438/528 |
| 5,296,387 A | * | 3/1994 | Aronowitz et al. ......... 438/528 |
| 5,360,749 A | * | 11/1994 | Anjum et al. ............... 438/291 |
| 6,268,640 B1 | * | 7/2001 | Park et al. ................... 438/525 |

FOREIGN PATENT DOCUMENTS

| | | | |
|---|---|---|---|
| JP | 2-191341 | * | 7/1990 |

* cited by examiner

*Primary Examiner*—Chandra Chaudhari

(57) ABSTRACT

Short channel effects are curtailed thereby increasing integrated circuit speed by forming a channel dopant with an asymmetric impurity concentration profile. Embodiments include ion implanting Si or Ge at a large tilt angle to amorphize a portion of a designated channel region with a varying degree of amorphization decreasing from the intended drain region to the intended source region, substantially vertically ion implanting channel dopant impurities and annealing. During annealing, diffusion is retarded in areas of increased amorphization, thereby forming an asymmetric impurity concentration gradient across the channel region increasing in the direction of the source region.

9 Claims, 3 Drawing Sheets

SEMICONDUCTOR DEVICE WITH ASYMMETRIC CHANNEL DOPANT PROFILE

RELATED APPLICATION

This application claims priority from Provisional Application No. 60/149,422 filed on Aug. 18, 1999 entitled "SEMICONDUCTOR DEVICE WITH ASYMMETRIC CHANNEL DOPANT PROFILE", the entire disclosure of which is incorporated by referenced herein.

TECHNICAL FIELD

The present invention relates generally to semiconductor devices comprising metal-oxide-semiconductor (MOS) transistors. The present invention has particular applicability in manufacturing highly integrated semiconductor devices with sub-micron features, high speed integrated circuitry and high reliability.

BACKGROUND ART

The escalating requirements for high performance and density associated with ultra large scale integration semiconductor devices require high speed and reliability and increased manufacturing throughput for competitiveness. As gate lengths are reduced into the deep sub-micron range, problems such as short channel effects are encountered. For example, "hot carrier injection" arises when device dimensions are reduced but the supply voltage is maintained, thereby increasing the electric field generated in the silicon substrate. Such an increased electric field enables electrons in the channel region to gain sufficient energy to be injected onto the gate dielectric, thereby degrading device performance. In addition, "punch through" arises when the drain voltage reaches a sufficiently large value, and the depletion layer associated with the drain spreads across the substrate and reaches the source, thereby enabling the charge carriers in the drain to punch through to the substrate.

A conventional approach in attempting to control or eliminate the "latch up" problem comprises forming a retrograde well structure implemented by ion implanting impurities of a conductivity type, opposite to that of the type of transistor, into the channel region with an attendant impurity concentration peak formed deep under the substrate. The impurity concentration profile of a channel region is related to the threshold voltage which normally increases with increasing impurity concentration of the channel region. Accordingly, when the impurity concentration peak is formed near the substrate surface, it is necessary to significantly increase the threshold voltage. However, when the impurity concentration peak is formed deep under the substrate surface, "latch up" would not be resolved. In addition, if the impurity concentration peak is formed deep under the substrate surface, the retrograde well does not effectively function as a potential barrier wall against noise caused by alpha particles emitted from radioactive elements in the package materials.

There exists a need for semiconductor devices having MOS transistors with reduced latch up and high reliability. There further exists a need for a method of manufacturing semiconductor devices having MOS transistors with reduced latch up and high reliability.

DISCLOSURE OF THE INVENTION

An advantage of the present invention is a simplified, efficient and production worthy method for forming MOS transistors having improved short channel characteristics.

Another advantage of the present invention is a semiconductor device having MOS transistors with improved short channel characteristics.

Additional advantages and other features of the present invention will be set forth in the description which follows and in part will be apparent to those having ordinary skill in the art upon examination of the following description or may be learned from the practice of the present invention. The objectives and advantages of the present invention may be realized and obtained as particularly pointed out in the appended claims.

According to the present invention, the foregoing and other advantages are achieved in part by a method of manufacturing a semiconductor device, the method comprising the sequential steps of: (a) providing a substrate containing an impurity of a first conductivity type; (b) forming a mask on the main surface of the substrate exposing a region in which a designated channel region of a second conductivity type, opposite the first conductivity type, MOS transistor is to be formed, the channel region having a first end proximate one source/drain region and a second end proximate the other source/drain region; (c) ion implanting an impurity at an angle to form an amorphous region in the designated channel region with a varying degree of amorphization decreasing from the first end toward the second end; (d) ion implanting an impurity of the first conductivity type into the designated channel region to form a channel implant overlapping the amorphous region; and (e) annealing to diffuse the channel implant forming a first conductivity type impurity concentration gradient across the channel region having a higher impurity concentration at the second end than at the first end.

Another aspect of the present invention is a semiconductor device comprising source/drain regions in the substrate; and a channel region, having one end approximate one of the source/drain regions and another approximate the other of the source/drain regions, containing ion implanted channel dopant impurities of the first conductivity type with an asymmetric concentration gradient increasing from one end to the other end of the channel region.

Additional advantages of the present invention will become readily apparent to those skilled in this art from the following detailed description, wherein only the preferred embodiment of the present invention is shown and described, simply by way of illustrating the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

In FIGS. 1–3, similar reference numerals denote similar features.

DESCRIPTION OF THE INVENTION

Figure 1:
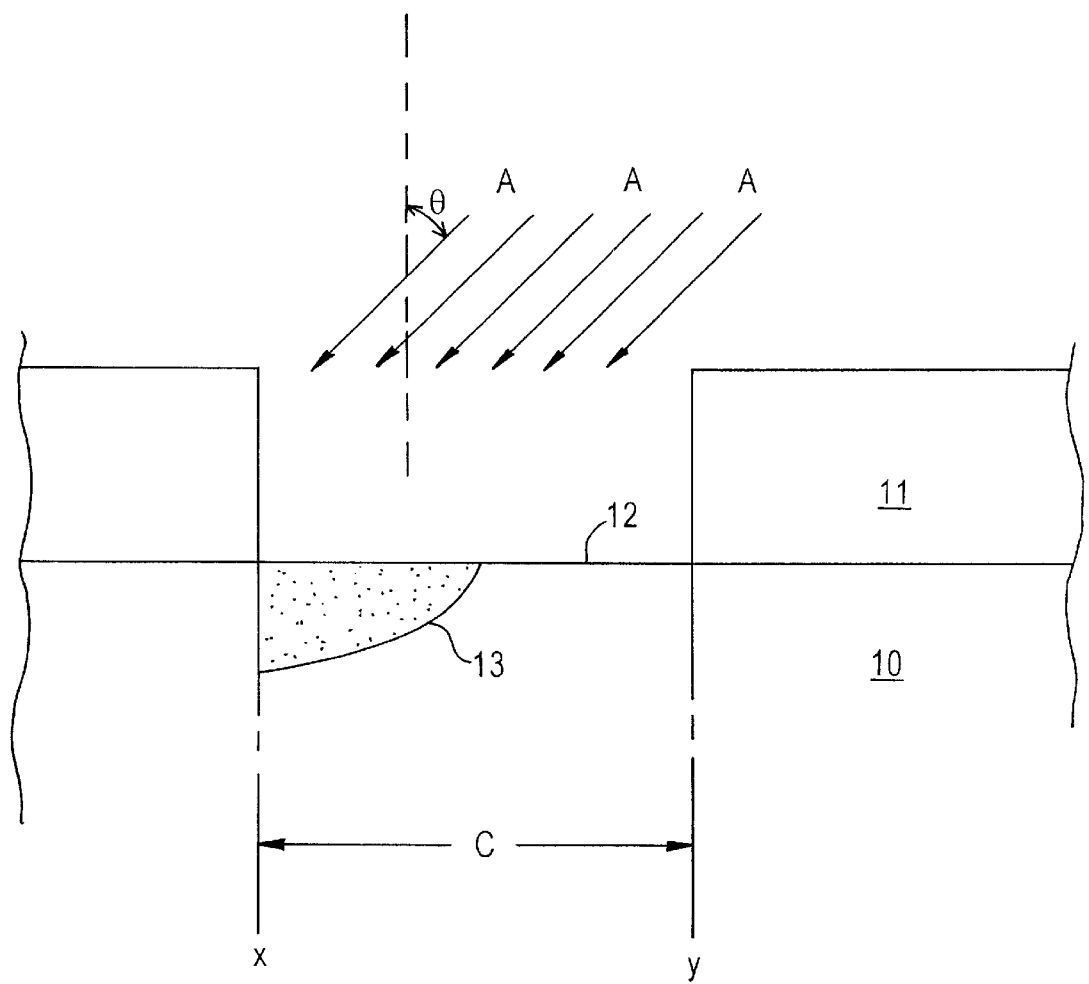
FIGS. 1–3 schematically illustrate sequential phases of a method in accordance with an embodiment of the present invention.

The present invention addresses and solves short channel effects, such as latch up and punch through, encountered in fabricating high integrated semiconductor devices with MOS transistors having sub-micron features, such as, a gate lengths less than about 0.1 micron, e.g., less than about 0.5 micron. In accordance with the present invention, an asymmetric channel dopant profile is formed in the channel region with an impurity concentration gradient increasing from one end of the channel to the other end, notably having a higher concentration at the source end of the channel region. The present invention enables modulation of the channel profile dopant and greater control of device performance. In addition, integrated circuits formed in accordance with the present invention exhibit greater operating speed.

In accordance with embodiments of the present invention, a designated channel region in a substrate is ion implanted with a neutral type impurity to form an amorphous region having a varying degree of amorphization decreasing from the first end of the designated channel region to the second end. As employed throughout this application, the term "substrate" is intended to encompass a doped semiconductor substrate, a well region formed in a semiconductor substrate, an epitaxial layer formed on a semiconductor substrate and a semiconductor layer formed on another type of substrate, e.g., glass or ceramic substrate.

Advantageously, the asymmetric amorphized region is formed by implanting neutral impurities, such as silicon (Si) or germanium (Ge), at a large tilt angle, e.g., about 5° to about 50° with respect to a plain substantially perpendicular to the main surface of the substrate. Suitable results can be obtained by ion implanting Si or Ge at an angle of about 15° to 45° with respect to a plane substantially perpendicular to the main surface of the substrate. Channel dopant impurities, of a conductivity type opposite to the conductivity type of the MOS transistor to be formed, are then ion implanted into the designated channel region overlapping the amorphized region. The channel implant is ion implanted at suitable conditions such that a first impurity concentration peak is formed at a first shallow depth from the main surface. Annealing is then conducted to diffuse the channel dopant impurities away from and deeper than the amorphized region, thereby shifting the impurity concentration peak to a second depth, greater than the first depth, from the main surface of the substrate, in a direction away from the amorphized region, i.e., in the direction of the contemplated source region. During such diffusion annealing, the amorphous region is crystallized.

Given the present disclosure and objectives, the optimum depths and implantation conditions for forming the amorphous region and channel dopant implant, and for annealing, can easily be determined in a particular situation.

During diffusion annealing, the amorphous region is generally crystallized. However, as a result of annealing, diffusion occurs as, for example, via transient enhanced diffusion and end-of-range defects generated by the preamorphous implantation. As a result of such diffusion, the impurity concentration the channel dopant at the source region generally exceeds the impurity concentration of the channel dopant at the drain region by about 5% to about 40%. Suitable results can be achieved by diffusion annealing such that the impurity concentration of the channel dopant varies from about $1\times10^{17}$ atoms $cm^{-3}$ at the drain end of the channel region to about $1\times10^{18}$ atoms $cm^{-3}$ at the source end. The resulting impurity concentration gradient of the channel dopant, e.g., an N-type dopant for a PMOS transistor or a P type dopant for an NMOS transistor, advantageously enables modulation of the channel dopant profile and control of the impurity concentration peak depth by controlling the angle of ion implantation to form the amorphous region and degree of amorphization.

Figure 2:
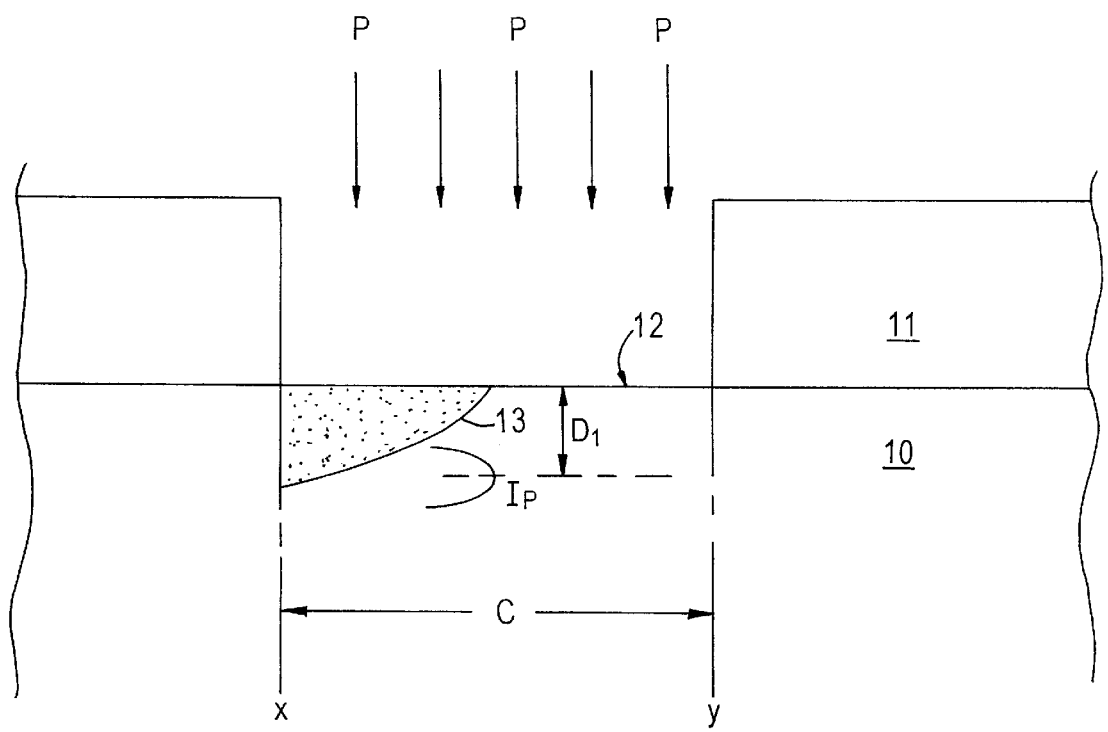
Figure 3:
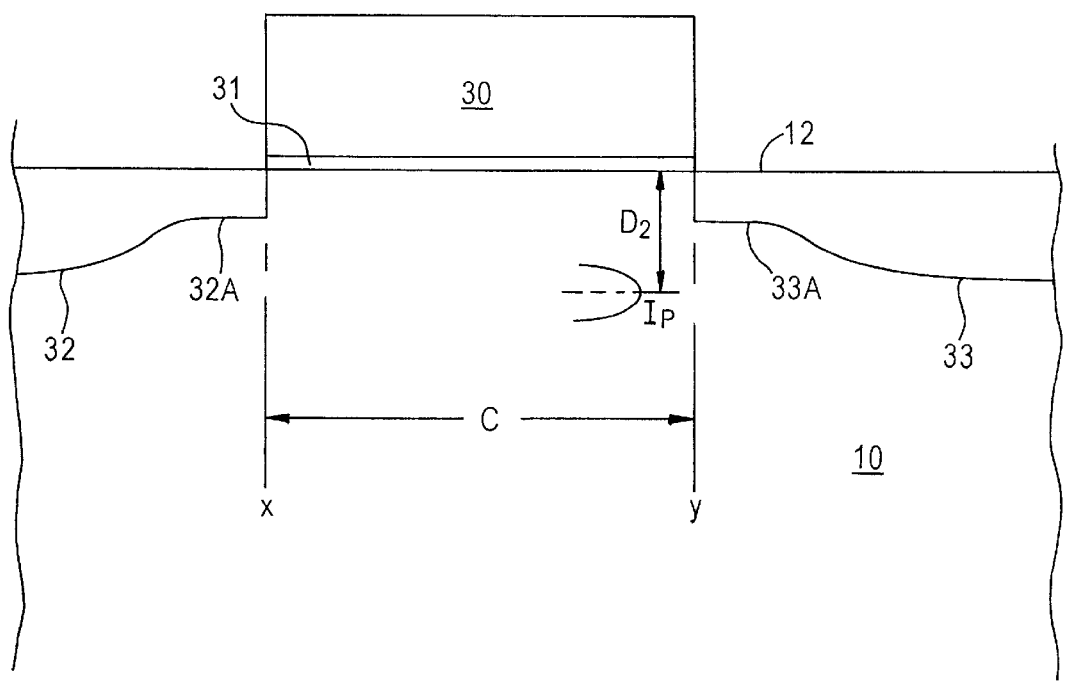

An embodiment of a method in accordance with the present invention is schematically illustrated in FIGS. 1–3, wherein similar reference numerals denote similar features. Adverting to FIG. 1, a mask 11, e.g., a photoresist mask, is formed on substrate 10 with an opening overlying a designated channel region in the substrate, identified by the letter C between imaginary lines X and Y, of an MOS transistor subsequently formed. Ion implantation is then conducted, as indicated by arrows A, at a large tilt angle θ, e.g., about 15° to about 45° with respect to an imaginary plane B substantially perpendicular to the main surface 12 of substrate 10. As a result of ion implanting a neutral impurity such as Si or Ge, a preamorphized region 13 is formed within channel region C having a varying degree of amorphization which decreases from end X toward end Y. Amorphous region 13 need not be formed to extend across the entire contemplated channel region C.

Adverting to FIG. 2, channel dopant impurities P are then ion implanted into substrate 10 in a substantially vertical direction with respect to substrate main surface 12 to form a channel dopant implant having a shallow impurity concentration peak $I_p$ at a first distance $D^1$ from main surface 12 of substrate 10. Annealing is the conducted to diffuse the implanted channel impurities deeper, and in the direction from X toward Y, in substrate 10. As shown in FIG. 3, the channel implant impurity concentration peak $I_p$ is driven toward Y to a depth $D^2$, greater than $D^1$, from the main surface 12 of substrate 10. The resulting designated channel region C has an impurity concentration gradient which increases from end X to end Y, thereby enabling modulation of the channel dopant profile and enhancing control of device performance.

Subsequently, in accordance with the conventional practices, a gate electrode 30 is formed overlying the designated channel region C with a gate dielectric layer 31 therebetween. Ion implantation of an impurity of a conductivity type opposite to that of the channel dopant impurity is then conducted in a conventional manner to form drain region 32, shallow drain extension 32A, source region 33 and shallow source extension 33A. Embodiments of the present invention include forming the channel dopant profile with an impurity concentration profile which increases from the drain region to the source region.

The present invention enjoys industrial applicability in various types of semiconductor devices, particularly in semiconductor devices having sub micron dimensions. The present enjoys particular applicability in highly miniaturized semiconductor devices comprising CMOS transistors with increased circuit speed and improved reliability.

In the previous description, numerous specific details are set forth such as specific material, structure, chemicals, process, etc., in order to provide a thorough understanding of the present invention. However, it should be recognized that the present invention can be practiced without resorting to the details specifically set forth. In other instances, well known processes and structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments, and is capable of changes or modifications within the scope of the inventive concept as expressed herein.

What is claimed is:

1. A method of manufacturing a semiconductor device containing a metal-oxide-silicon (MOS) transistor, the method comprising the sequential steps of:

(a) providing a substrate containing an impurity of a first conductivity type;

(b) forming a mask on the main surface of the substrate exposing a region in which a designated channel region of a second conductivity type, opposite the first conductivity type, MOS transistor will be formed, the channel region having a first end proximate one source/drain region and a second end proximate the other source/drain region;

(c) ion implanting an impurity at an angle to form an amorphous region, in the designated channel region with a varying degree of amorphization decreasing from the first end toward the second end;

(d) ion implanting an impurity of the first conductivity type into the designated channel region to form a channel implant overlapping the amorphous region; and (e) annealing to diffuse the channel implant forming a first conductivity type impurity concentration gradient across the channel region having a higher impurity concentration at the second end than at the first end.

2. The method according to claim 1, comprising ion implanting a neutral impurity in step (c).

3. The method according to claim 2, comprising ion implanting silicon or germanium as the neutral impurity.

4. The method according to claim 3, comprising ion implanting silicon or germanium at an angle of about 15° to about 45° with respect to a plane substantially perpendicular to the main surface and toward the first end.

5. The method according to claim 3, comprising ion implanting in step (d) in a direction substantially perpendicular to the main surface.

6. The method according to claim 3, wherein, after annealing in step (d), the impurity concentration of the first conductivity type impurity at the second end is about 5% to about 40% greater than the concentration of the first conductivity type impurity at the first end.

7. The method according to claim 3, wherein, after annealing in step (d), the impurity concentration of the first conductivity type varies from about $1\times10^{17}$ atoms $cm^{-3}$ at the first end to about $1\times10^{18}$ atoms $cm^{-3}$ at the second end.

8. The method according to claim 3, comprising:

ion implanting in step (c) to form the impurity channel implant of the first conductivity type having an impurity concentration peak at a first depth from the main surface; and annealing in step (d) to diffuse the channel implant impurity of the first conductivity type shifting the impurity concentration peak deeper to a second depth from the main surface, greater than the first depth, and toward the second end.

9. The method according to claim 3, comprising:

(e) forming a gate electrode over the designated channel region with a gate dielectric layer therebetween; and (f) ion implanting an impurity of the second conductivity type to form source/drain regions, with the source region proximate the second end of the channel region.

* * * * *